(12) United States Patent
Hazucha et al.

(10) Patent No.: US 8,710,869 B2
(45) Date of Patent: Apr. 29, 2014

(54) HIGH-SPEED COMPARATOR WITH ASYMMETRIC FREQUENCY RESPONSE

(75) Inventors: Peter Hazucha, Beaverton, OR (US); Tsung-Hao Chen, Taipei (TW); Tanay Karnik, Portland, OR (US); Chung-Ping Chen, Madison, WI (US)

(73) Assignee: Intel Corporation, Santa Clara, CA (US)

( * ) Notice: Subject to any disclaimer, the term of this patent is extended or adjusted under 35 U.S.C. 154(b) by 2491 days.

(21) Appl. No.: 10/422,238

(22) Filed: Apr. 23, 2003

(65) Prior Publication Data
US 2011/0095788 A1 Apr. 28, 2011

(51) Int. Cl.
*H03K 5/22* (2006.01)
*H03K 5/24* (2006.01)

(52) U.S. Cl.
CPC .................. *H03K 5/2481* (2013.01)
USPC ......................................................... 327/66

(58) Field of Classification Search
USPC ........... 327/50–53, 56, 57, 63–66, 68, 74, 75, 327/77–79, 88, 89
See application file for complete search history.

(56) References Cited

U.S. PATENT DOCUMENTS

| | | | |
|---|---|---|---|
| 6,696,869 B1 * | 2/2004 | Tan ................................. | 327/108 |
| 6,741,121 B2 * | 5/2004 | Huber ............................ | 327/563 |
| 6,911,858 B2 * | 6/2005 | Mori .............................. | 327/307 |
| 7,242,172 B2 * | 7/2007 | Carlson et al. ................ | 323/272 |

* cited by examiner

*Primary Examiner* — Lincoln Donovan
*Assistant Examiner* — Sibin Chen
(74) *Attorney, Agent, or Firm* — Schwegman, Lundberg & Woessner, P.A.

(57) ABSTRACT

A comparator to provide an output voltage indicative of comparing an input voltage with a reference voltage, where the comparator has an asymmetric frequency response. With an asymmetric frequency response, the bandwidth of the input voltage may be greater than the bandwidth of the reference voltage. A comparator includes a differential pair of transistors coupled to a current mirror and biased by a current source, where in one embodiment, a capacitor shunts the sources of the differential pair. In a second embodiment, a capacitor couples the input voltage port to the gates of the current mirror transistors. In a third embodiment, the comparator utilizes both capacitors of the first and second embodiments.

11 Claims, 6 Drawing Sheets

HIGH-SPEED COMPARATOR WITH ASYMMETRIC FREQUENCY RESPONSE

FIELD

The present invention relates to comparator circuits, and more particularly, to comparator circuits with asymmetric frequency response.

BACKGROUND

A voltage comparator may be used to compare the value of an input voltage signal $V_{IN}$ with a reference voltage $V_{REF}$. In this context, the voltage comparator may be viewed as an amplifier to amplify the difference $V_{REF} - V_{IN}$ with high gain. Such voltage comparisons are often performed in analog-to-digital converters, peak detectors, zero-crossing detectors, and full-wave rectifiers. Some or all of these mentioned circuits may be utilized in a computer system. For example, consider the computer system illustrated in FIG. 1. Microprocessor die 102 comprises many sub-blocks, such as arithmetic logic unit (ALU) 104 and on-die cache 106. Microprocessor 102 may also communicate to other levels of cache, such as off-die cache 108. Higher memory hierarchy levels, such as system memory 110, are accessed via host bus 112 and chipset 114. In addition, other off-die functional units, such as graphics accelerator 116 and network interface controller (NIC) 118, to name just a few, may communicate with microprocessor 102 via appropriate busses or ports. Power supply 120 provides a regulated voltage to microprocessor 102, as well as perhaps other system components in FIG. 1. Voltage comparators, for example, may find application in power supply 120 as part of a full-wave rectifier, or may find application in NIC 118 as part of an analog-to-digital converter for signal communication over a physical link (not shown).

A prior art voltage comparator is shown in FIG. 2. The voltage comparator of FIG. 2 is seen to be a differential amplifier comprising differential pair 202 and 204, current source 206, and a current mirror (transistors 208 and 210). Two voltage gains may be defined for the differential amplifier of FIG. 2. Let $A_{IN}$ denote the input voltage gain $|v_{OUT}/v_{IN}|$ when $V_{REF}$ is held constant, where $v_{OUT}$ is the small-signal voltage component of $V_{OUT}$ and $v_{IN}$ is the small-signal voltage component of $V_{IN}$. Let $A_{REF}$ denote the reference voltage gain $|v_{OUT}/v_{REF}|$ when $V_{IN}$ is held constant, where $v_{REF}$ is the small-signal voltage component of $V_{REF}$.

Prior art voltage comparators tend to have approximately equal 3 dB bandwidths for the two gains $A_{IN}$ and $A_{REF}$. A typical frequency response for the comparator of FIG. 2 is shown in FIG. 3, where curves for the two voltage gains $A_{REF}$ and $A_{IN}$ are labeled as such. From FIG. 3, it is seen that the two 3 dB bandwidths are approximately equal to each other.

DESCRIPTION OF EMBODIMENTS

In some applications for voltage comparators, the bandwidth of reference voltage signal $V_{REF}$ may be significantly less that that of the input voltage signal $V_{IN}$. In particular, voltage comparators may be used in a power supply noise monitor employing a maximum and minimum detector circuit. In this particular application, the reference voltage signal $V_{REF}$ is a relatively low-frequency or DC signal and the input voltage signal $V_{IN}$ is a relatively high-frequency signal. In such applications, it is not necessary for a voltage comparator to have equal 3 dB bandwidths for the reference voltage gain $A_{REF}$ and the input voltage gain $A_{IN}$. Embodiments of the present invention take advantage of this observation by trading off bandwidth for the reference voltage gain for an increase in bandwidth for the input voltage gain. As a result, embodiments of the present invention have an asymmetric frequency response, and may be termed asymmetric frequency response high-speed comparators.

Figure 4:
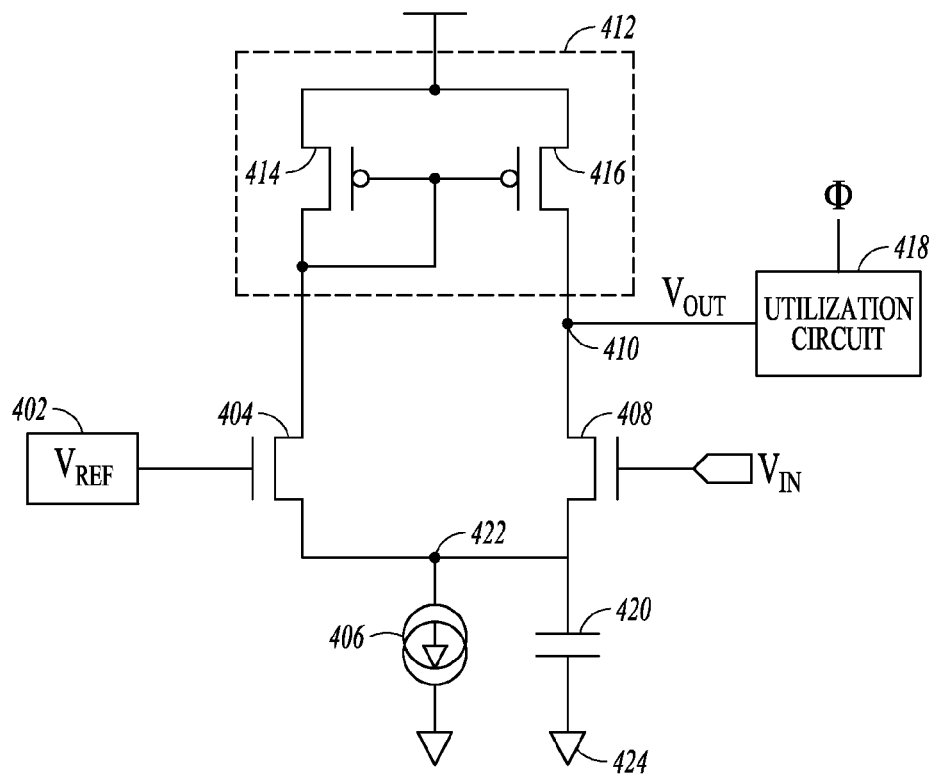
FIG. 4 is an embodiment of the present invention.

An embodiment of the present invention is provided in FIG. 4, showing a voltage comparator comprising differential pair 404 and 408, current mirror 412, current source 406, and capacitor 420. Voltage reference source 402 provides reference voltage $V_{REF}$ at the gate of nMOSFET 404. The gate of nMOSFET 408 is at the input voltage $V_{IN}$. Current source 406 provides bias current to differential pair nMOSFETs 404 and 408. The output voltage $V_{OUT}$ may be considered to be taken at output port (node) 410. Current mirror 412 provides bias current and a relatively large small-signal load impedance to nMOSFET 408. Various current mirrors may be employed. In the particular embodiment of FIG. 4, current mirror 412 comprises pMOSFETs 414 and 416 connected as shown. Capacitor 420 is connected in parallel with current source 406, providing a capacitive impedance path from node 422 to rail 424. (Rail 424 may be ground, a substrate, or a power rail.) At high frequencies, capacitor 420 shunts node 422 to rail 424. The two voltage gains $A_{IN}$ and $A_{REF}$ for the voltage comparator of FIG. 4 are defined in similar fashion to those of FIG. 2.

The load at output port 410 is represented by utilization circuit 418. In general, utilization circuit 418 utilizes $V_{OUT}$ to perform a useful function, such as, for example, a control function for voltage regulation or analog-to-digital conversion. Utilization circuit 418 may comprise a latch circuit to latch output voltage $V_{OUT}$ at specific time instants controlled by clock signal $\phi$.

Figure 1:
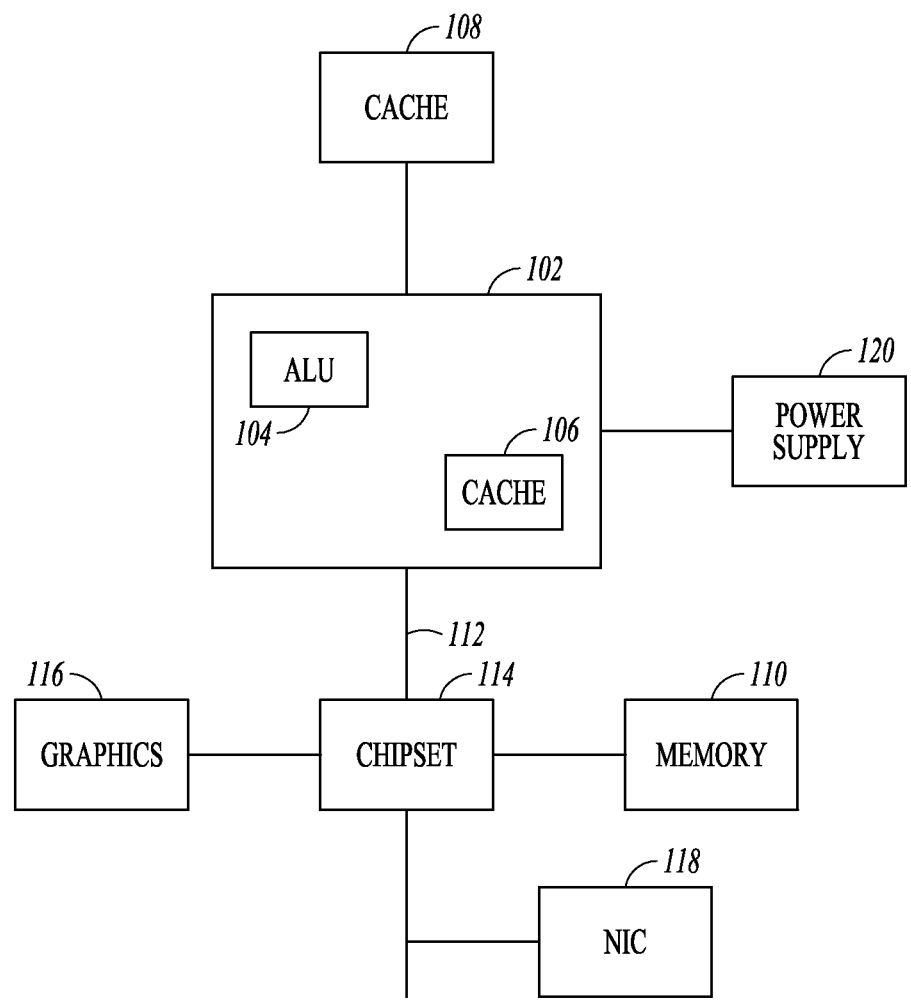
FIG. 1 is a simplified, high-level abstraction of a computer system.
Figure 2:
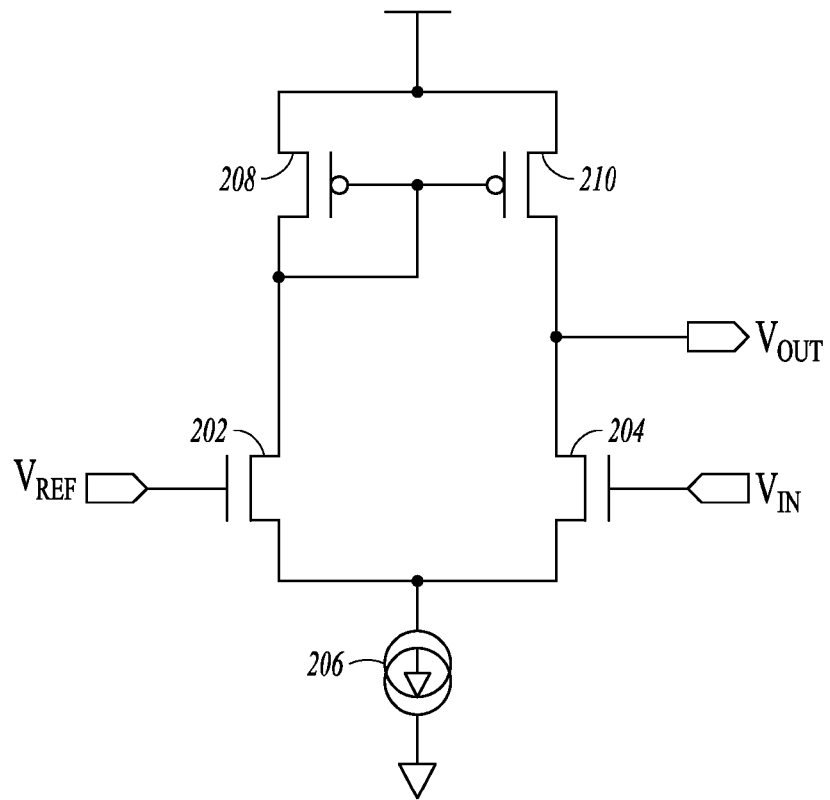
FIG. 2 is a prior art comparator at the circuit level.
Figure 3:
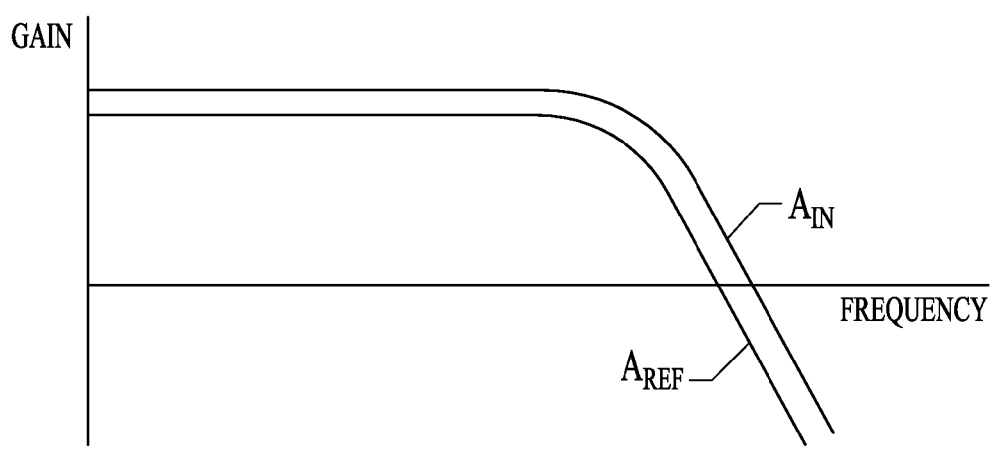
FIG. 3 shows a typical frequency response for the comparator of FIG. 2.

For the embodiment of FIG. 4 at low frequency operation, $\omega C \ll 1/Z$, where C is the capacitance of capacitor 420, $\omega$ is the signal frequency of either $V_{IN}$ or $V_{REF}$, and Z is the small-signal impedance of current source 406, the voltage comparator behaves similarly to the amplifier of FIG. 2. In particular, the circuits of FIGS. 4 and 2 have identical DC voltage gains, and consequently the presence of capacitor 402 does not cause overshoot or undershoot in the frequency characteristics of the voltage gains $A_{IN}$ and $A_{REF}$ for the voltage comparator of FIG. 2.

Figure 5:
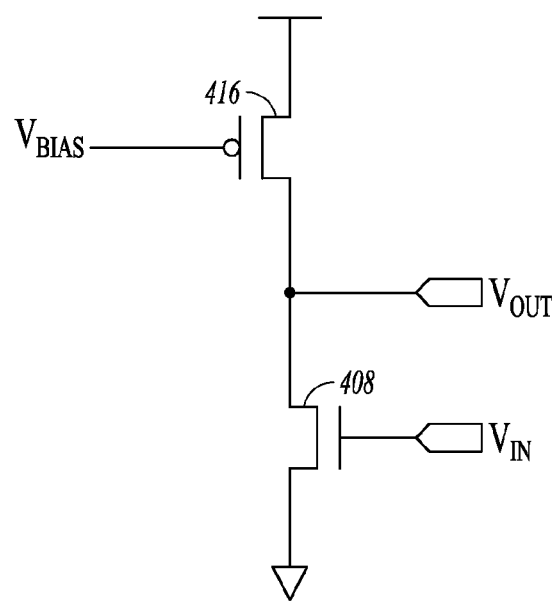
FIG. 5 is a high-frequency equivalent circuit for the input signal gain of the comparator of FIG. 4.

At high frequency operation, $\omega C \gg 1/Z$, the voltage comparator of FIG. 4 behaves very differently from that of FIG. 2. For the input voltage gain $A_{IN}$, a high frequency equivalent circuit for the voltage comparator of FIG. 4 is provided in FIG. 5, where corresponding transistors in FIGS. 4 and 5 are labeled accordingly. The bias voltage $V_{BIAS}$ is the gate and drain voltage of pMOSFET 414. At high frequencies, $V_{BIAS}$ may be considered constant because, as discussed earlier, $V_{REF}$ is held constant when considering the voltage gain $A_{IN}$, and capacitor 420 provides a high-frequency short circuit to rail 424.

The circuit of FIG. 5 is seen to be a simple single-stage, common-source amplifier. At high frequency operation, device parasitic capacitance causes a reduction in voltage gain $A_{IN}$ for both voltage comparators of FIGS. 2 and 4. However, because the capacitances due to transistors 404 and 414 do not play a role in the high frequency equivalent circuit of FIG. 5, the circuit of FIG. 5 has less parasitic capacitance in the signal path of $V_{IN}$ compared to the voltage comparator of FIG. 2. Consequently, the 3 db bandwidth for the input voltage gain $A_{IN}$ of the voltage comparator of FIG. 4 is larger than that of FIG. 2 (assuming the same technology and device sizes are used for both circuits in FIGS. 2 and 4).

Figure 6:
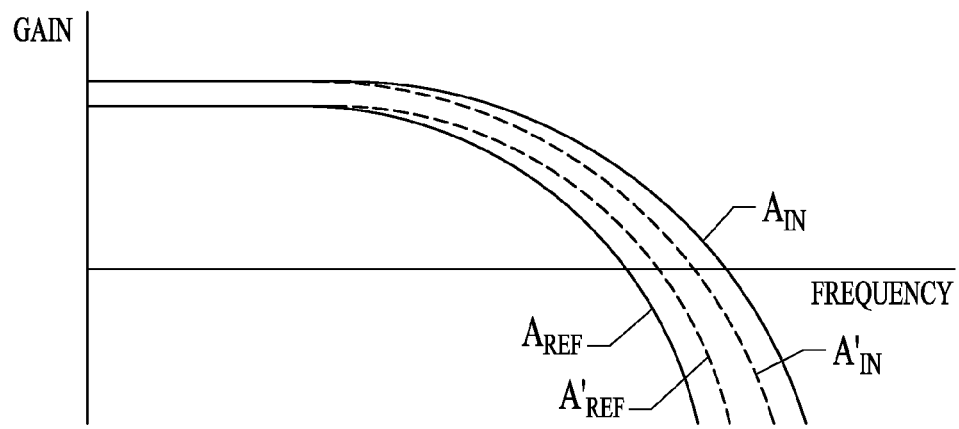
FIG. 6 shows a typical frequency response for the comparator of FIG. 4.

FIG. 6 provides typical voltage gain curves for the voltage comparator of FIG. 4 compared to that of FIG. 2. In FIG. 6, the two voltage gain curves $A_{REF}$ and $A_{IN}$ for the voltage comparator of FIG. 4 are solid curves and labeled as $A_{REF}$ and $A_{IN}$, respectively. The two voltage gain curves $A_{REF}$ and $A_{IN}$ for the voltage comparator of FIG. 2 are dashed curves and labeled as $A_{REF}'$ and $A_{IN}'$ respectively. The curves in FIG. 6 illustrate the tradeoff in 3 db bandwidth, where the presence of capacitor 420 increases the 3 db bandwidth of $A_{IN}$ at the expense of decreasing the 3 db bandwidth of $A_{REF}$. However, as discussed in the Background, for many applications there is no penalty in decreasing the 3 db bandwidth of $A_{REF}$ because the bandwidth of the reference voltage signal is much less than the bandwidth of the input voltage signal.

Figure 7:
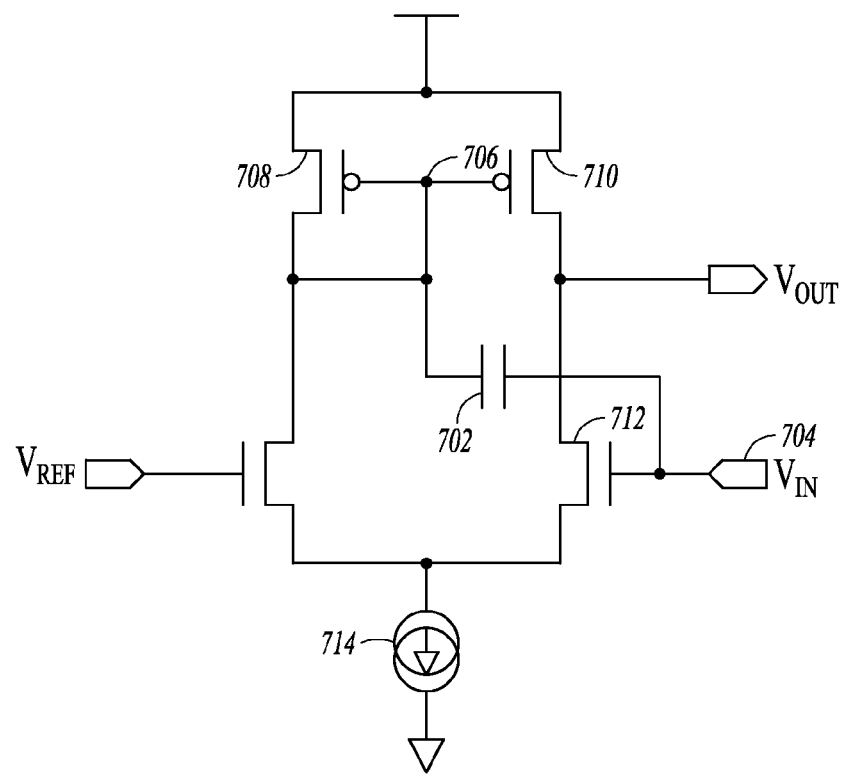
FIG. 7 is another embodiment of the present invention.
Figure 8:
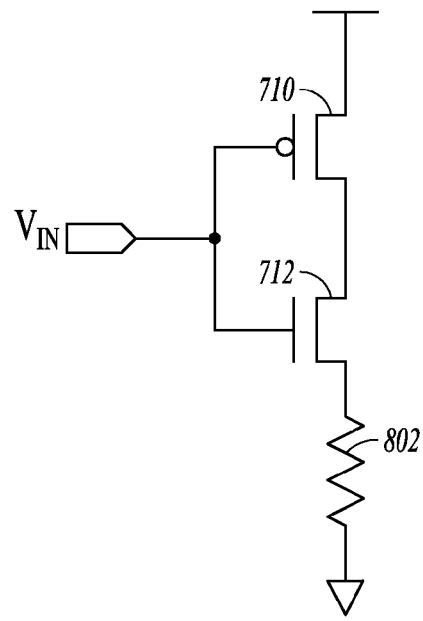
FIG. 8 is a high-frequency equivalent circuit for the input signal gain of the comparator of FIG. 7.

Another embodiment of the present invention at the circuit level is provided by FIG. 7, where for simplicity a utilization circuit and voltage reference source are not shown. In FIG. 7, capacitor 702 provides a capacitive impedance path from input port 704 to node 706, where node 706 may be taken as the gates of current mirror transistors 708 and 710 or as the drain of pMOSFET 708. For the input voltage gain $A_{IN}$, a high frequency equivalent of the circuit of FIG. 7 is shown in FIG. 8, where corresponding transistors in FIGS. 8 and 7 are labeled accordingly. Resistor 802 in FIG. 8 represents the high-frequency, small-signal output impedance of current source 714.

The circuit of FIG. 8 is similar to an inverter amplifier. The small-signal DC gain for the circuit in FIG. 8 is larger than the small-signal DC gain of the differential amplifier of FIG. 2. Accordingly, with proper sizing of capacitor 702, the 3 db bandwidth for the voltage gain $A_{IN}$ for the circuit of FIG. 7 may be increased over that of FIG. 2. A similar tradeoff in $A_{IN}$ and $A_{REF}$ for the circuit of FIG. 7 results as for the case with the circuit of FIG. 4. The curves for the voltage gains $A_{IN}$ and $A_{REF}$ of the circuit of FIG. 7 are similar to that of FIG. 6, and also show that the presence of capacitor 702 allows an increase in $A_{IN}$ to at the expense of a decrease in $A_{REF}$.

Figure 9:
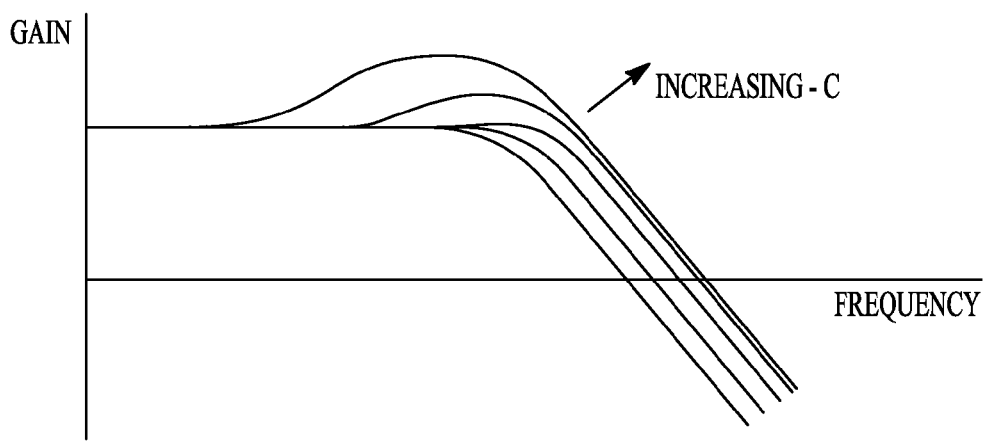
FIG. 9 shows a typical frequency response for the comparator of FIG. 7.

FIG. 9 shows in a general way the effect that an increasing capacitance of capacitor 702 has upon the input voltage gain $A_{IN}$, where the arrow in FIG. 9 indicates the correspondence between the gain curves and increasing capacitance. As seen in FIG. 9, increasing capacitance can lead to a high frequency voltage gain exceeding the DC gain, thereby causing an overshoot in the frequency characteristic of the voltage gain. Consequently, in a preferred embodiment, the capacitance of capacitor 702 should be sized properly to avoid overshoot. Depending upon the capacitance of capacitor 702, anywhere between 0% and 100% of $v_{IN}$ may be coupled to node 706. Overshoot is prevented if this coupling is less than $g_{m712}/2g_{m710}$, where $g_{m712}$ and $g_{m710}$ are the small-signal transconductances of transistors 712 and 710, respectively. If a flat frequency response is not important, then overshoot may be tolerated.

Figure 10:
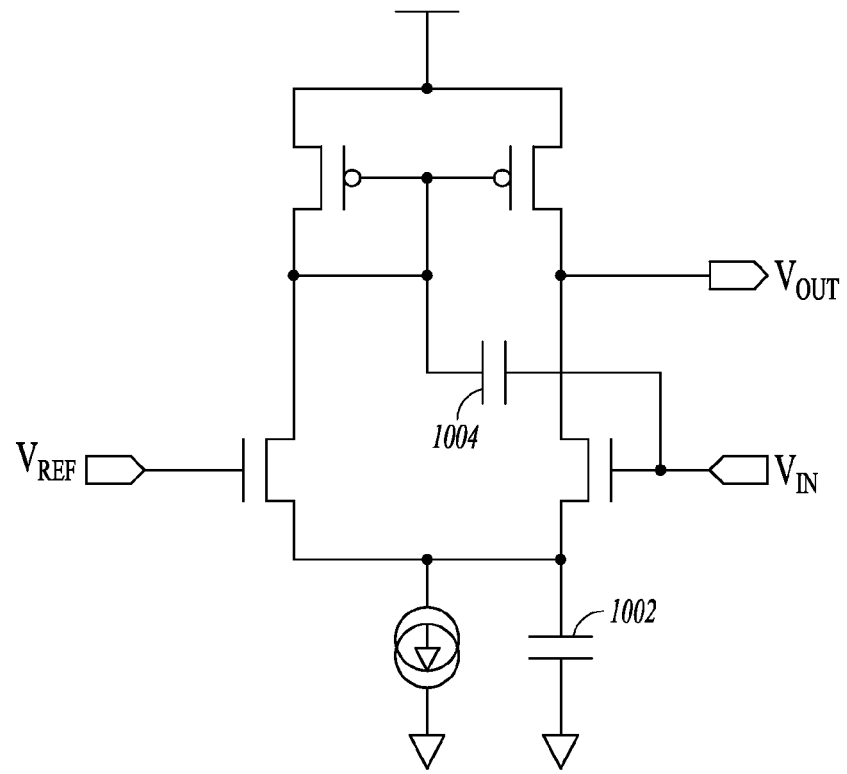
FIG. 10 is another embodiment of the present invention that incorporates the features of both of the embodiment comparators of FIGS. 4 and 7.
Figure 11:
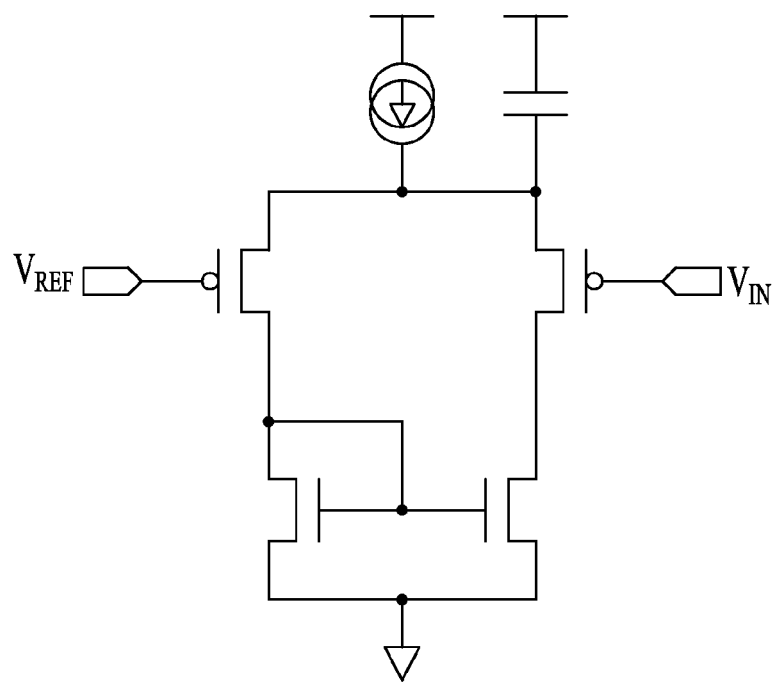
FIG. 11 is the dual of the comparator circuit of FIG. 4.

In another embodiment, two capacitors, 1002 and 1004, may be utilized as shown in FIG. 10, resulting in a further increase in input voltage gain $A_{IN}$ at the expense of a further decrease in reference voltage gain $A_{REF}$. The remarks on overshoot regarding the circuit of FIG. 7 also apply to the circuit of FIG. 10. Various modifications may be made to the disclosed embodiments without departing from the scope of the invention as claimed below. For example, other embodiments dual to those disclosed above may be realized by replacing the nMOSFETs with pMOSFETs. An example of the dual to the voltage comparator of FIG. 4 is shown in FIG. 11. Furthermore, it is to be understood in these letters patent that the phrase "A is connected to B" means that A and B are directly connected to each other by way of an interconnect, such as metal or polysilicon. This is to be distinguished from the phrase "A is coupled to B", which means that the connection between A and B may not be direct. That is, there may be an active device or passive element between A and B. It is also to be understood in these letters patent that a "current source" may mean either a current source or a current sink.

What is claimed is:

1. A die comprising a comparator, the comparator comprising:
   a first transistor comprising a drain, a source, and a gate;
   a second transistor comprising a drain, a source, and a gate;
   a first input port connected to the gate of the first transistor;
   a second input port connected to the gate of the second transistor;
   an output port having an output voltage and connected to the drain of the second transistor;
   a current mirror coupled to the first and second transistors;
   a current source connected to the sources of the first and second transistors;
   a first capacitor connected to the source of the second transistor,
   the current mirror comprising:
      a third transistor comprising a gate, a source, and a drain connected to the drain of the first transistor and connected to the gate of the third transistor;
      a fourth transistor comprising a gate connected to the gate of the third transistor, a source connected to the source of the third transistor, and a drain connected to the drain of the second transistor; and
   a second capacitor comprising a first terminal connected to the gate of the second transistor, and comprising a second terminal connected to the gates of the third and fourth transistors.

2. The die as set forth in claim 1, further comprising:
   a utilization circuit coupled to the output port to latch the output voltage.

3. The die as set forth in claim 2, further comprising:
   a rail;
   wherein the first capacitor comprises a first terminal connected to the source of the second transistor and a second terminal connected to the rail.

4. The die as set forth in claim 3, further comprising:
   a voltage reference source to provide a reference voltage to the first input port.

5. The die as set forth in claim 1, further comprising:
   a rail;

wherein the first capacitor comprises a first terminal connected to the source of the second transistor and a second terminal connected to the rail.

6. The die as set forth in claim 5, further comprising:
a voltage reference source to provide a reference voltage to the first input port.

7. The die as set forth in claim 1, wherein the first and second transistors are nMOSFETs.

8. A computer system comprising:
a die comprising a microprocessor;
an off-die memory coupled to the microprocessor;
a comparator comprising:
    a first transistor comprising a drain, a source, and a gate;
    a second transistor comprising a drain, a source, and a gate;
    a first input port connected to the gate of the first transistor;
    a second input port connected to the gate of the second transistor;
    an output port having an output voltage and connected to the drain of the second transistor;
    a current mirror coupled to the first and second transistors;
    a current source connected to the sources of the first and second transistors;
    a first capacitor connected to the source of the second transistor, wherein the first capacitor is chosen so as to reduce the trans-conductance of the comparator and avoid overshoot;
    a utilization circuit coupled to the output port to latch the output voltage:
    a voltage reference source to provide a reference voltage to the first input port a rail;
    wherein the first capacitor comprises a first terminal connected to the source of the second transistor and a second terminal connected to the rail; and
    a second capacitor, the second capacitor comprises a first terminal connected to the gate of the second transistor, and comprises a second terminal connected to the gates of the third and fourth transistors.

9. The computer system as set forth in claim 8, the current mirror comprising:
    a third transistor comprising a gate, a source, and a drain connected to the drain of the first transistor and connected to the gate of the third transistor; and
    a fourth transistor comprising a gate connected to the gate of the third transistor, a source connected to the source of the third transistor, and a drain connected to the drain of the second transistor;
    wherein the second capacitor comprises a first terminal connected to the gate of the second transistor, and comprises a second terminal connected to the gates of the third and fourth transistors.

10. The computer system as set forth in claim 8, wherein the first and second transistors are nMOSFETs.

11. The computer system as set forth in claim 8, wherein the comparator is integrated on the die.

\* \* \* \* \*